(12) United States Patent
Wu et al.

(10) Patent No.: US 12,745,399 B2
(45) Date of Patent: Sep. 22, 2026

(54) METHOD OF FORMING MEMORY STRUCTURE

(71) Applicant: Winbond Electronics Corp., Taichung City (TW)

(72) Inventors: Bo-Lun Wu, Taichung City (TW); Po-Yen Hsu, Taichung City (TW); Tse-Mian Kuo, New Taipei City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 426 days.

(21) Appl. No.: 18/495,339

(22) Filed: Oct. 26, 2023

(65) Prior Publication Data

US 2024/0147726 A1 May 2, 2024

(30) Foreign Application Priority Data

Oct. 27, 2022 (TW) ................................. 111140876

(51) Int. Cl.
*H10B 43/30* (2023.01)

(52) U.S. Cl.
CPC .................................. *H10B 43/30* (2023.02)

(58) Field of Classification Search
CPC .. H10B 43/30; H10B 41/30; H10B 41/00–70; H10D 64/035; H10D 30/68–689; G11C 2216/06–10; G11C 16/0408–0458
See application file for complete search history.

(56) References Cited

U.S. PATENT DOCUMENTS 10,325,919 B1 * 6/2019 Teng ...................... H10B 41/49
10,734,398 B2 * 8/2020 Huang ................... H10B 41/27

FOREIGN PATENT DOCUMENTS

KR 10-0489517 B1 3/2004
TW I283047 B 6/2005
TW 202121703 A 6/2021

* cited by examiner

*Primary Examiner* — Cuong B Nguyen
(74) *Attorney, Agent, or Firm* — MUNCY, GEISSLER, OLDS & LOWE, P.C.

(57) ABSTRACT

A method of forming a memory structure is provided. The method includes providing a substrate, wherein the substrate has a plurality of isolation structures, and the isolation structures include a plurality of first protrusions protruding above the substrate; replacing the first protrusions with a plurality of second protrusions to define a plurality of predetermined regions of floating gates between the second protrusions. The replacing step includes forming an insulation filling material between the first protrusions and on the substrate, and performing a patterning process to the insulation filling and the first protrusions to form second protrusions to define the predetermined regions of the floating gates, and forming a plurality of floating gates in the predetermined regions of the floating gates.

20 Claims, 8 Drawing Sheets

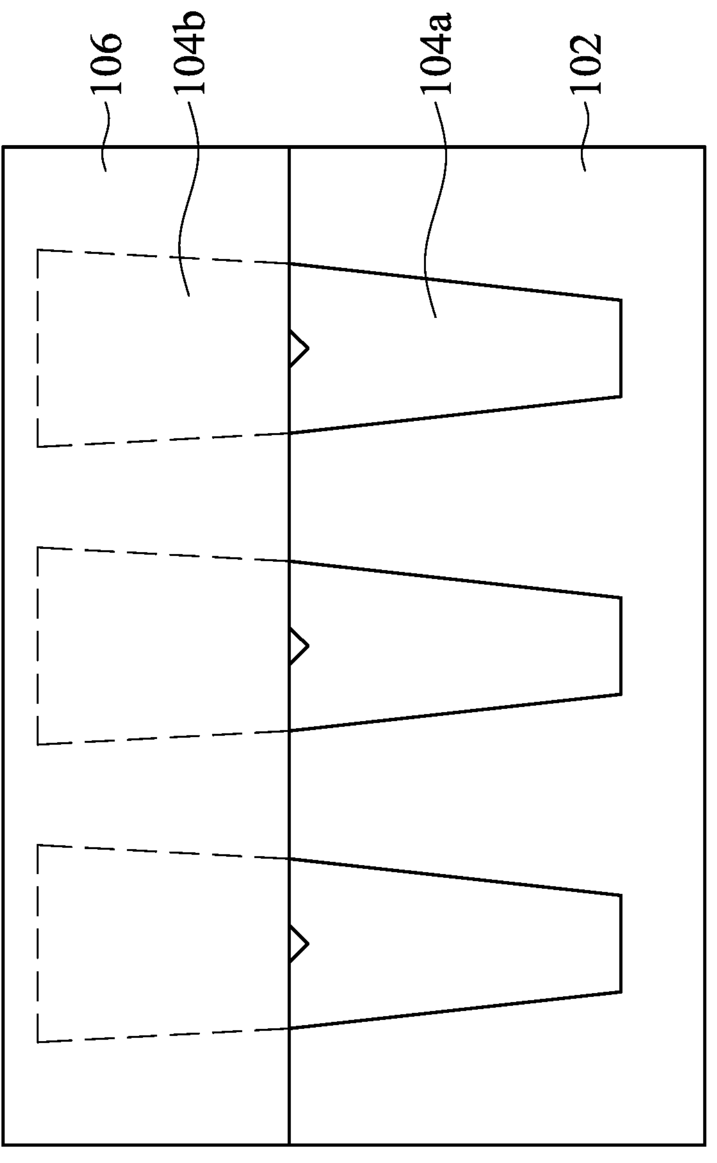
FIG. 3

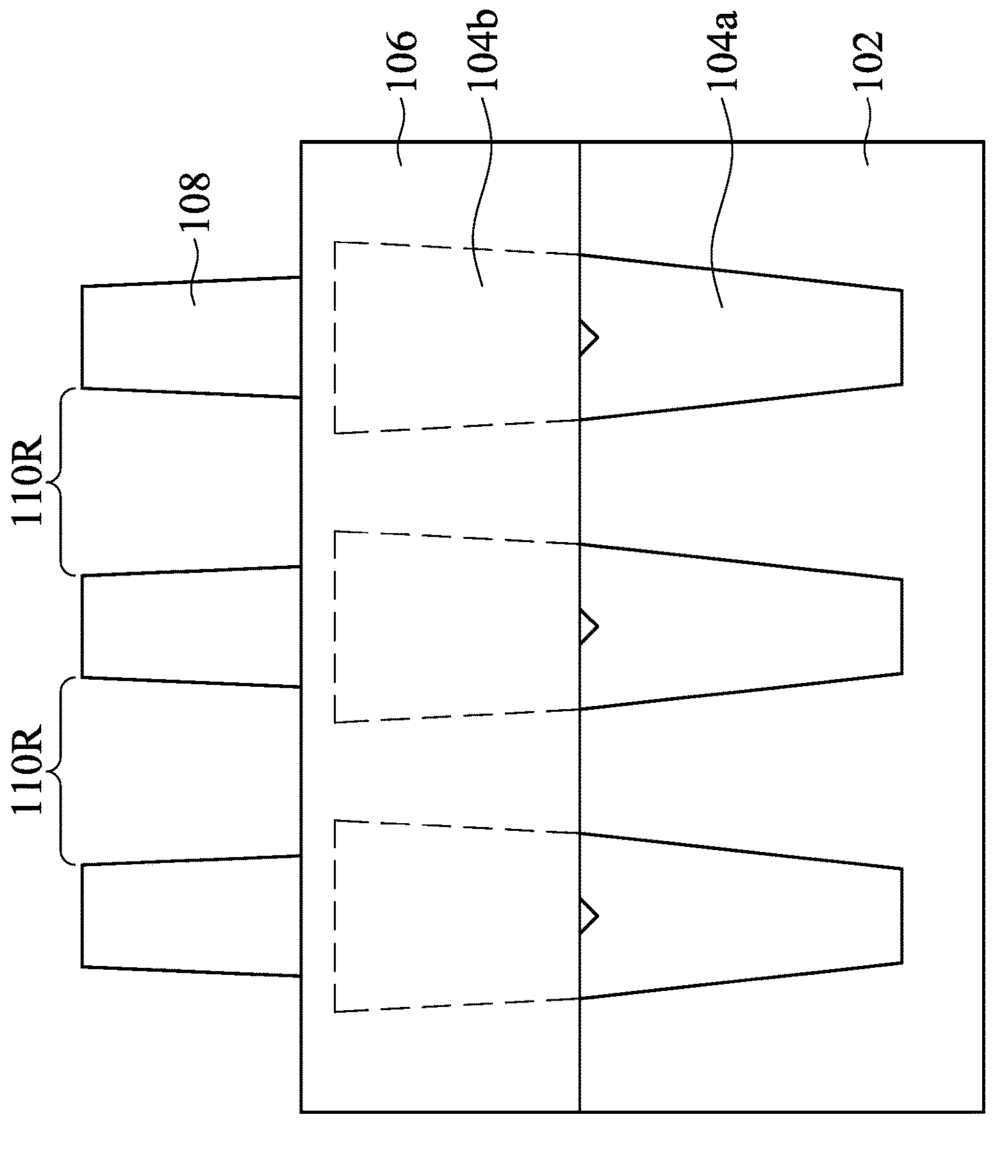
106
104b
104a
102
108
110R
110R
FIG. 4
100

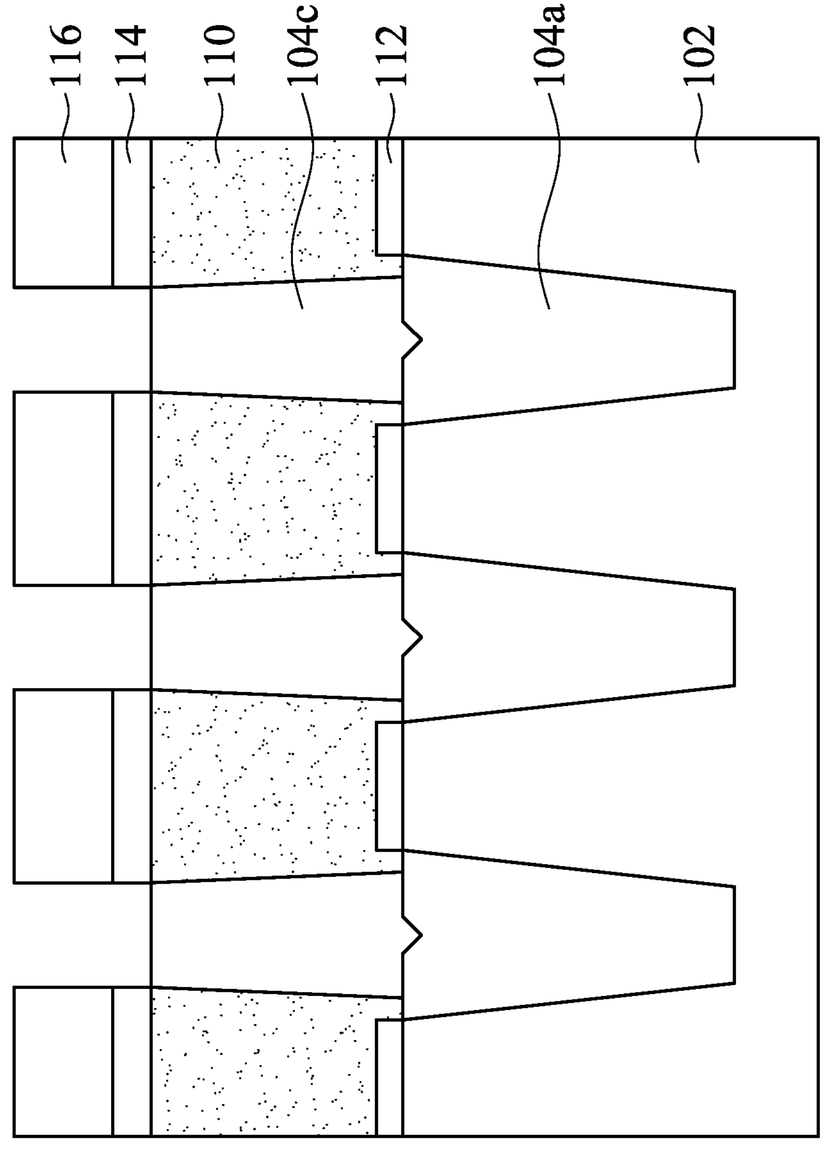
FIG. 8

METHOD OF FORMING MEMORY STRUCTURE

CROSS REFERENCE TO RELATED APPLICATIONS

This application claims priority of Taiwan Patent Application No. 111140876 filed on Oct. 27, 2022, the entirety of which is incorporated by reference herein.

BACKGROUND

Technical Field

The present disclosure relates to a semiconductor structure, and in particular to a method for forming a memory structure having a floating gate.

Description of the Related Art

Memory devices are used in a variety of electronic applications, such as personal computers, cell phones, digital cameras, and other electronic devices. Memory devices are typically fabricated by depositing insulating or dielectric layers, conductive layers, and semiconductor layer materials on a semiconductor substrate, and patterning the various material layers using lithography and etching techniques to form circuit components on the semiconductor substrate.

The semiconductor industry continues to improve the integration of various electronic components by continuing to shrink the size of the smallest components so that more components can be integrated into designated areas. However, scaling down the component size makes it more difficult to control the critical dimension unity (CDU) of components. Therefore, there is still a need for an improved method of scaling down component sizes to manufacture a memory device that meets product requirements.

BRIEF SUMMARY

An embodiment of the present invention provides a method of forming a memory structure. The method includes providing a substrate with a plurality of isolation structures, wherein the isolation structures comprise a plurality of first protrusions protruding above the substrate. Replacing the first protrusions with a plurality of second protrusions to define a plurality of predetermined regions of the floating gates between the second protrusions. Steps of replacing the first protrusions include forming an insulation filling material between the first protrusions and on the substrate and performing a patterning process on the insulation filling material and on the first protrusions to form second protrusions to define the predetermined regions of the floating gates. The patterning process comprises forming a patterned mask layer on the insulation filling material, and performing a first etching process on the insulation filling material and/or the first protrusions with the patterned mask layer. The method further includes forming a plurality of floating gates in the predetermined regions of the floating gates.

BRIEF DESCRIPTION OF THE DRAWINGS

FIGS. 1, 2, 3, 4, 5, 6, 7, and 8 are cross-sectional views illustrating various stages in the process of fabricating a memory structure with isolation structures and floating gates according to an embodiment of the present disclosure.

DETAILED DESCRIPTION

Figure 1:
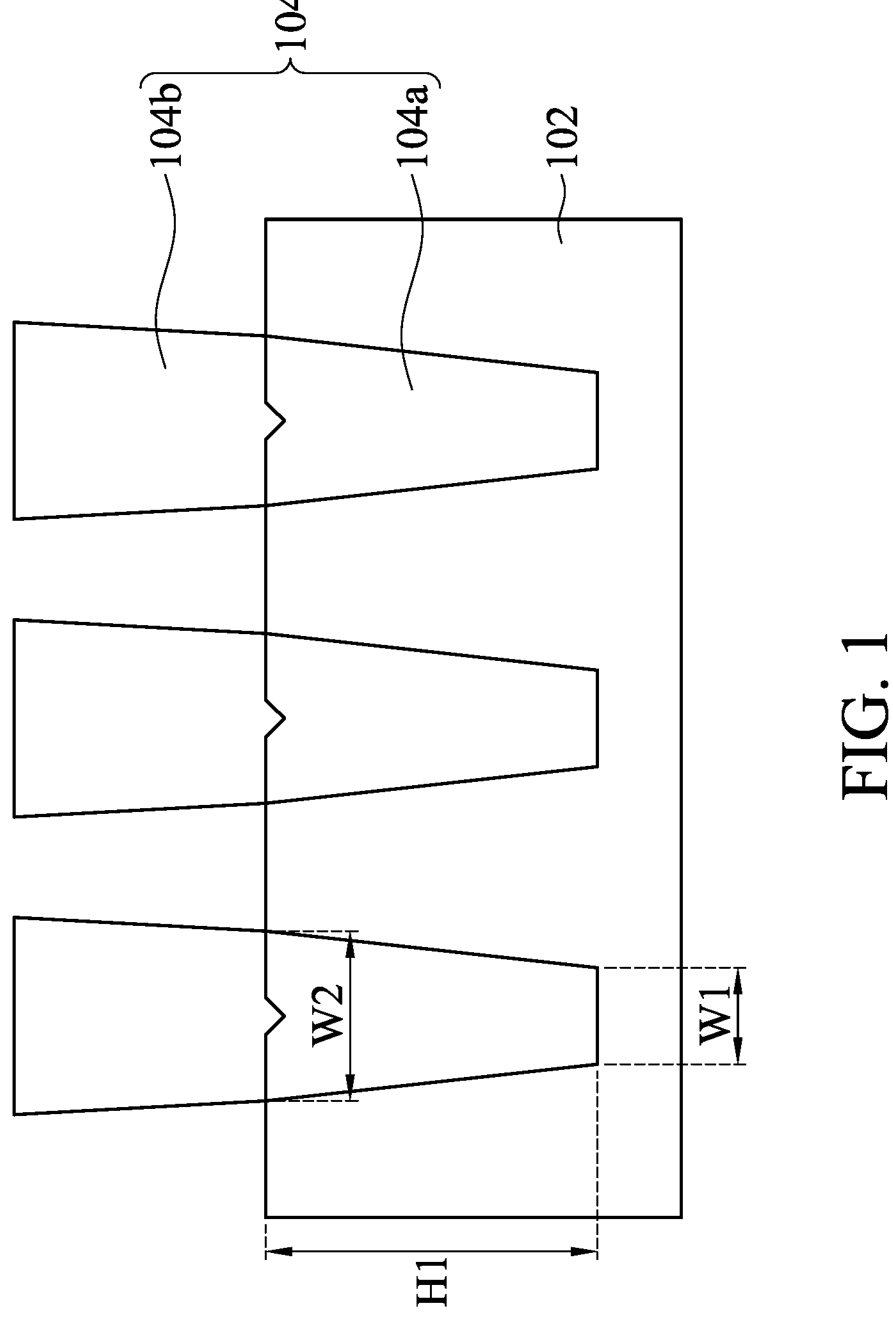

The following describes embodiments of the method of forming memory structures. However, it should be noted that those embodiments provide many suitable inventive concepts that can be implemented in a wide variety of specific contexts. Those embodiments described herein are merely illustrative of specific ways to make and use the invention and do not limit the scope of the invention. For example, the formation of a first feature over or on a second feature in the description that follows may include embodiments in which the first and second features are formed in direct contact, and may also include embodiments in which additional features may be formed between the first and second features, such that the first and second features may not be in direct contact. Furthermore, in the drawings and descriptions of the present embodiments, the same reference numerals are used to denote the same or similar components.

In the prior art, the critical dimension (CD) of the floating gate is defined by the first protrusion of the isolation structure and is affected by many related processes, such as patterning of the active region, pull-back process, oxygen annealing, atomic layer deposition (ALD) oxides, etc., thus making CDUs of floating gates difficult to control. To solve the above problem, in the method for forming the memory structure provided by the present embodiments, an independent patterning process is used to define predetermined regions of the floating gates, which can reduce the influence of the related process on the critical dimensions. As a result, it can not only increase the CDU of the floating gate but can also avoid damage to the active region caused by the patterning process, thereby increasing the stability of the memory device.

FIGS. 1-8 are schematic cross-sectional views illustrating different stages of forming a memory structure according to some embodiments of the present disclosure. Referring to FIG. 1, the memory structure 100 includes a substrate 102 and isolation structures 104 located in the substrate 102 and protruding from the substrate 102. In some embodiments, the substrate is a semiconductor substrate. The substrate 102 may be an elemental semiconductor substrate, such as a silicon substrate, or a germanium substrate; or a compound semiconductor substrate, such as a silicon carbide substrate, or a gallium arsenide substrate. In some embodiments, the semiconductor substrate 102 may be a semiconductor-on-insulator (SOI) substrate.

The isolation structure 104 has a base portion 104*a* in the substrate 102 and a first protrusion 104*b* protruding from the substrate 102. The isolation structure 104 is used to isolate active regions of a plurality of memory cells in the substrate 102. The isolation structures 104 may be formed of various suitable insulating materials. In some embodiments, the material of the base portion 104*a* is silicon oxide, such as spin-on glass (SOG), high-density plasma (HDP) silicon oxide, high aspect ratio process (HARP) formed silicon oxide, for example, doped silicon oxide such as phosphosilicate glass (PSG), borophosphosilicate glass (BPSG), etc., to form a high aspect ratio isolation structure. The base portion 104*a* of the isolation structure 104 may be formed by a suitable deposition technique, such as chemical vapor deposition (CVD), high-density plasma chemical vapor deposition (HDPCVD), or HARP. In some embodiments, the depth H1 of the base portion 104*a* is in the range of about 200 nm to about 400 nm, the width W1 of the bottom surface of the base portion 104_a_ is in the range of about 10 nm to about 50 nm, and the width W2 of the top surface of the base portion 104_a_ is in the range of about 10 nm meters to about 50 nm. In some embodiments, the aspect ratio of the base portion 104_a_ ranges from about 1 to 20, such as 1 to 3. In some embodiments, the isolation structure 104 with a high aspect ratio may be formed by using a flowable chemical vapor deposition (FCVD) process. For example, a high aspect ratio recess is first filled with a high fluidity insulating material, and then an insulating material with a better insulating effect is formed on the higher fluidity insulating material. Therefore, the base portion 104_a_ and the first protrusion 104_b_ of the isolation structure 104 may have different material compositions. In some embodiments, the material of the base portion 104_a_ is doped silicon oxide such as PSG and BPSG, and the material of the first protrusion 104_b_ is undoped silicon oxide. The first protrusion 104_b_ may be formed by suitable deposition techniques, such as CVD, ALD, or the like. In other embodiments, the material of the first protrusion 104_b_ may also be the same or similar to the material of the base portion 104_a_ of the isolation structure 104. In some embodiments, a liner (not shown) may be formed in the high aspect ratio recesses before the formation of the isolation structures 104. The disposition of the liner can repair lattice defects on the exposed surface of the substrate 102 caused by the etching process. The liner includes an insulating material, such as oxide. In some embodiments, the liner layer includes silicon oxide ($SiO_2$). In some embodiments, in-situ steam generation (ISSG) may be used to oxidize a portion of the semiconductor substrate 102 to form a liner. In other embodiments, the liner is formed using a CVD process and/or an ALD process.

Next, using a separate patterning step, the first protrusion 104_b_ is replaced by a second protrusion 104_c_ (see FIGS. 2-6) to define the predetermined regions of the floating gates 110R (see FIG. 4). Detail descriptions are as follows.

Figure 2:
Figure 2:
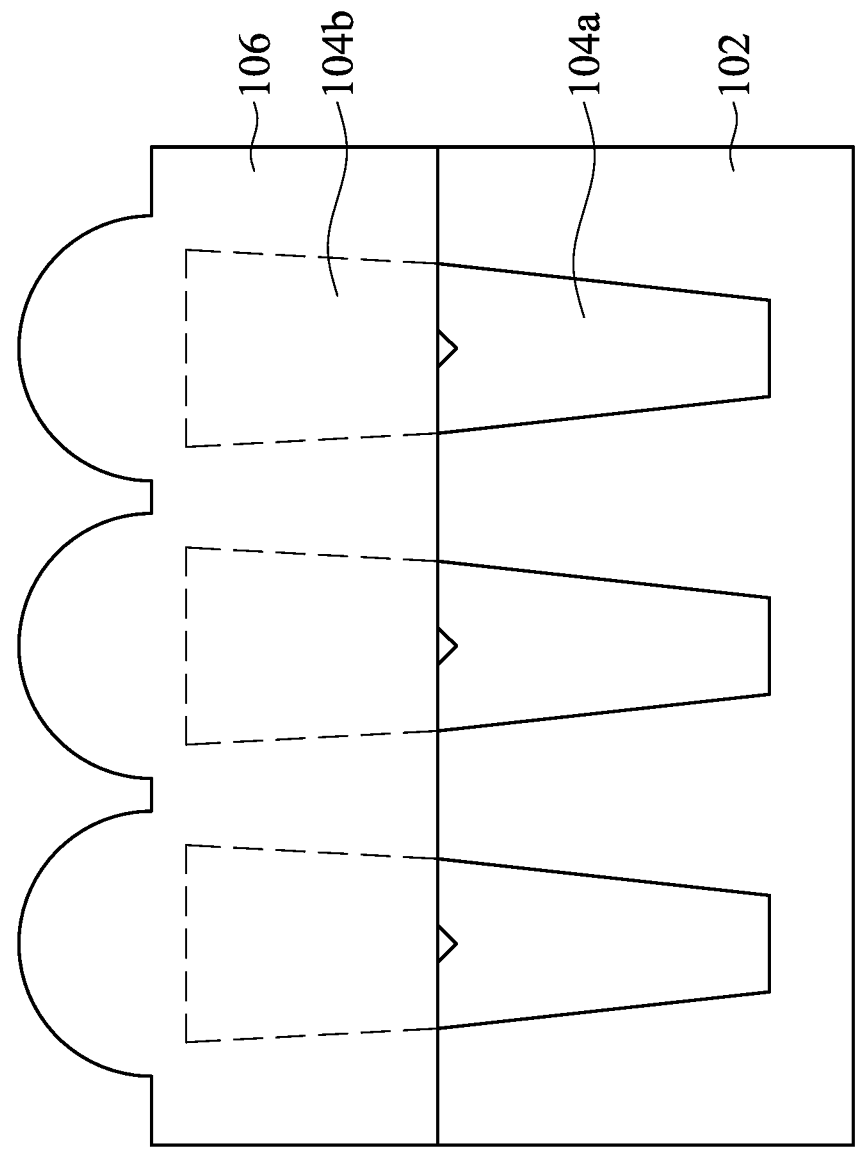
Figure 2:

Referring to FIG. 2, an insulation filling material 106 is firstly formed between the first protrusions 104_b_ and above the substrate 102. The insulation filling material 106 includes an insulating material, such as oxide, nitride, or the combination thereof. In some embodiments, the insulation filling material 106 may be formed by ISSG, CVD process, or ALD process. In some embodiments, the insulation filling material 106 includes the same material as the first protrusion 104_b_, so there may be no apparent interface between the two (shown as the dashed line in FIGS. 2-4).

Next, a planarization process is performed on the insulation filling material 106 and/or the first protrusions 104_b_ to form a flat surface, which is beneficial to the subsequent patterning process. As shown in FIG. 3, in some embodiments, after the planarization process, the first protrusion 104_b_ is still covered by the insulation filling material 106. In other embodiments, after the planarization process, the top surface (not shown) of the first protrusion 104_b_ is exposed. In some embodiments, the planarization process is a chemical mechanical polishing (CMP) process.

Figure 5:
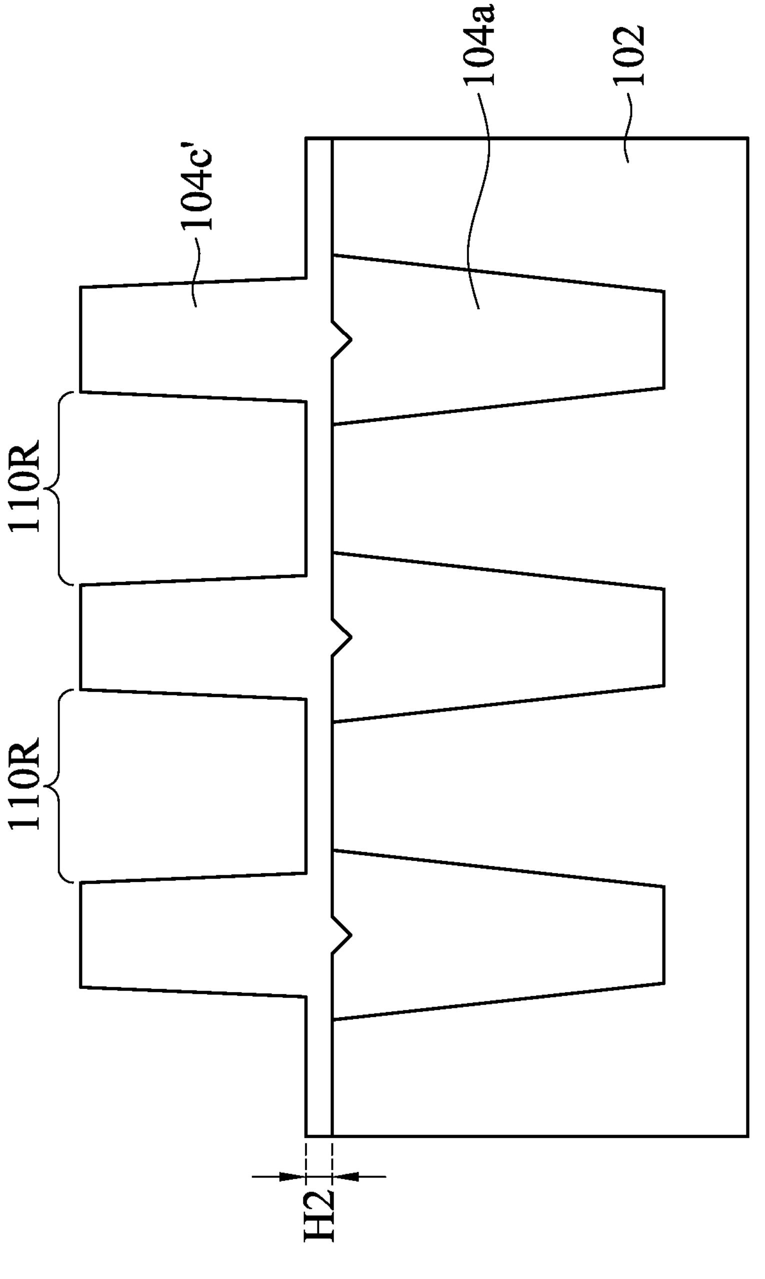
Figure 6:
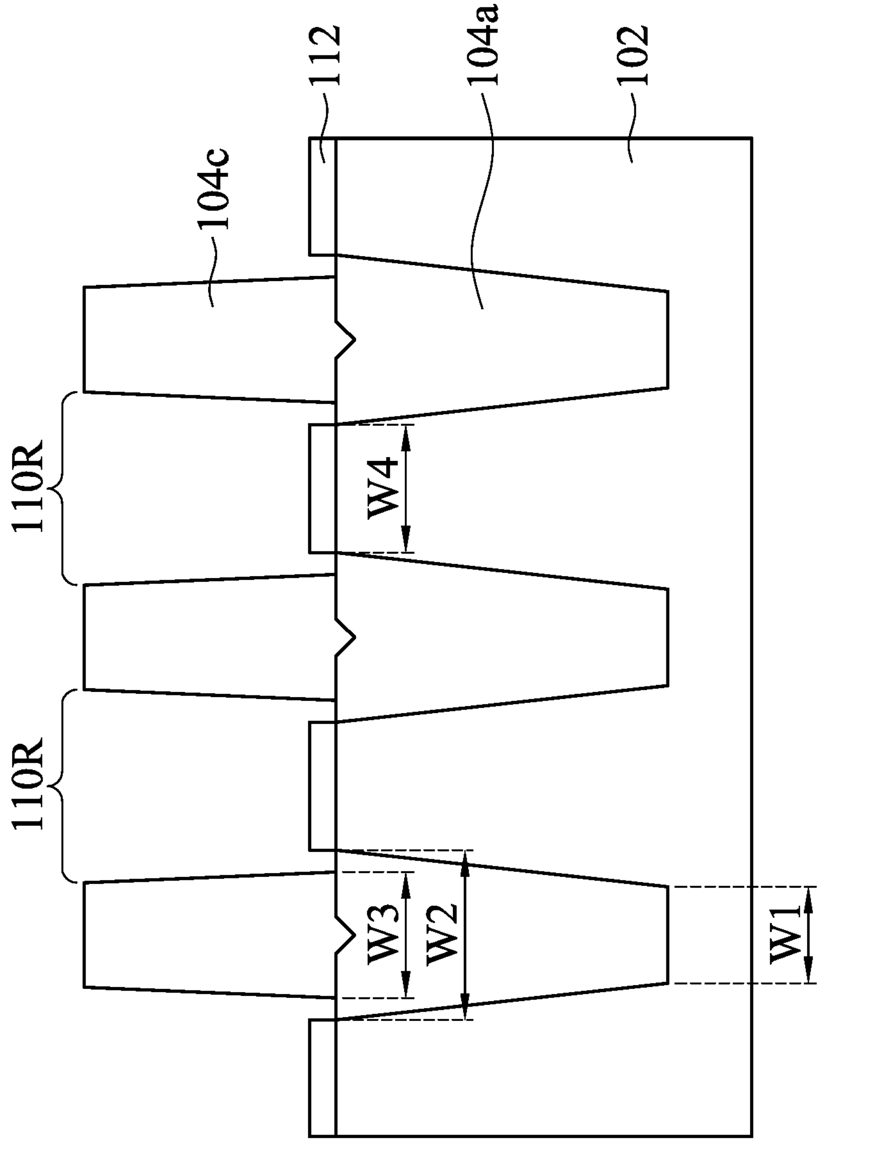

Next, a patterning process is performed on the insulation filling material 106 and the first protrusion 104_b_ to define the predetermined regions of the floating gates 110R, as shown in FIGS. 4-6.

In detail, referring to FIG. 4, a patterned mask layer 108 is formed on the flat surface of the insulation filling material 106 and/or the first protrusion 104_b_. In some embodiments, the location of the patterned mask layer 108 corresponds to the location of the base portion 104_a_ of the isolation structure 104.

Next, a first etching process is performed on the insulation filling material 106 and/or the first protrusion 104_b_ by using the patterned mask layer 108 as an etching mask, as shown in FIG. 5. Note that after the first etching process, the remaining insulation filling material 106 and/or the first protrusions 104_b_ form a plurality of connected second protrusions 104_c_' that blanketly covers the semiconductor substrate 102, to avoid the damage to the substrate 102 caused by the first etching process. The position of each recess between two adjacent second protrusions 104_c_' corresponds to the position of the predetermined region of the floating gate 110R. The first etching process may be a dry etching process, a wet etching process, or a combination thereof. In some embodiments, the first etching process is a dry etching process, such as reactive ion etching (RIE). The parameters (such as time) of the etching process can be controlled to adjust the thickness H2 of the insulation filling material 106 and/or the first protrusion 104_b_ in the predetermined region of the floating gate 110R. In some embodiments, after the first etching process, the second protrusion 104_c_' having a trapezoidal structure may be formed. In some embodiments, the wet etching process uses hydrofluoric acid, hot phosphoric acid, or a combination thereof.

Next, a second etching process is performed on the insulation filling material 106 and/or the first protrusions 104_b_ in the predetermined regions of the floating gates 110R to expose the top surface of the substrate 102 in the predetermined regions of the floating gates 110R to form a plurality of separated second protrusions 104_c_, which is shown in FIG. 6. The wet etching process may use hydrofluoric acid as an etchant. In one embodiment, the bottom surface width W3 of the second protrusion 104_c_ may be smaller than the top surface width W2 of the base portion 104_a_, to provide a wider predetermined region of the floating gate 110R, thereby improving the electrical performance of the floating gates.

Next, a tunneling dielectric layer 112 is formed on the top surface of the substrate 102 of the predetermined regions of the floating gates 110R. The material of the tunneling dielectric layer 112 may include oxides such as silicon oxide; nitrides such as silicon oxynitride, silicon nitride; or other suitable dielectric materials. In some embodiments, the thickness of the tunneling dielectric layer 112 ranges from about 2 nm to 10 nm, and the width W4 ranges from about 30 nm to 60 nm. The tunneling dielectric layer 112 may be formed by a suitable deposition process, such as thermal oxidation, CVD, ALD, and the like. Before forming the tunneling dielectric layer 112, a pre-clean process may be performed on the top surface of the substrate 102 in the predetermined regions of the floating gates 110R to remove impurities on the top surface of the substrate 102 and facilitate the subsequent formation of the tunnel dielectric layer 112 with good quality. In some embodiments, the top surface of the substrate 102 is pre-cleaned using diluted hydrogen fluoride (DHF), but the invention is not limited thereto. In some embodiments, the second etching process and the pre-cleaning process may be performed simultaneously to reduce process time.

Figure 7:
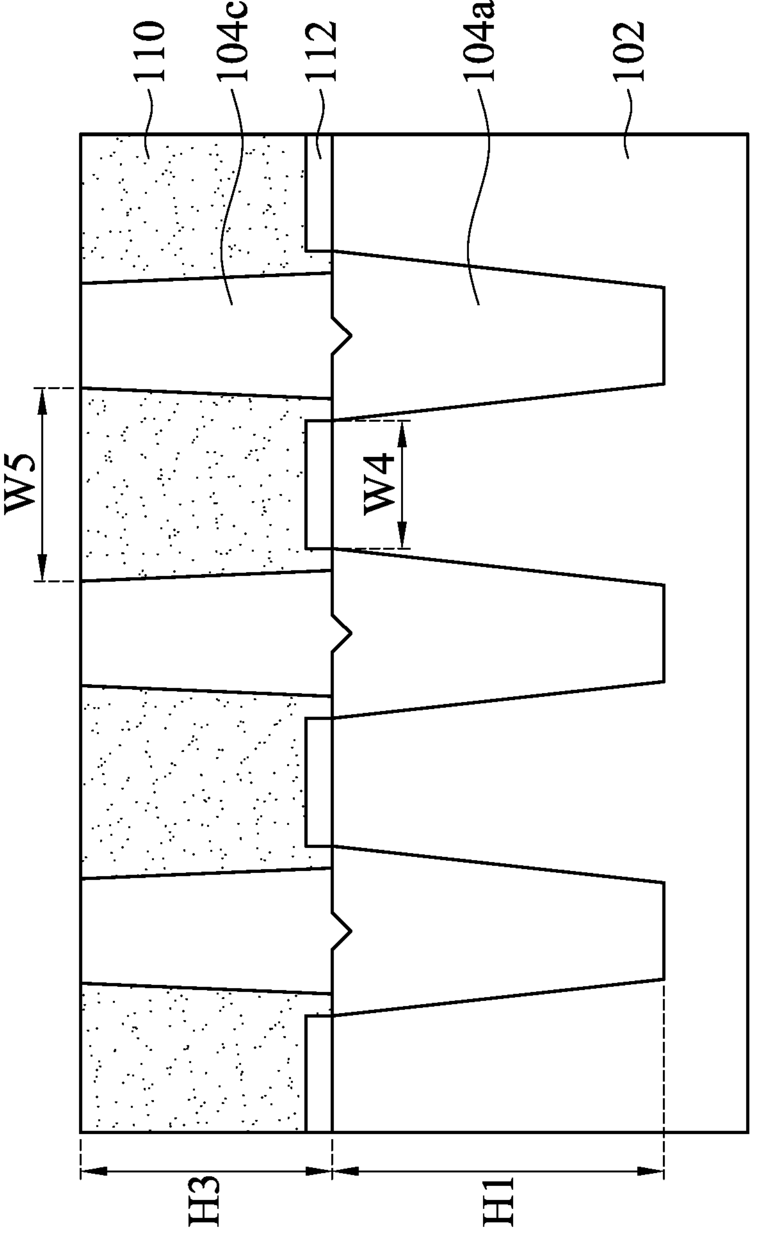

Next, a plurality of floating gates 110 are formed, as shown in FIG. 7. The steps of forming the floating gates 110 include (1) depositing a floating gate material over the tunneling dielectric layer 112 in the predetermined regions of the floating gates 110R and the second protrusions 104_c_; (2) performing a planarization process on the floating gate material until the top surfaces of the second protrusions 104_c_ are exposed, leaving the floating gate material between the second protrusions 104_c_ as the floating gate 110.

In some embodiments, the floating gate 110 has an inverted trapezoidal structure, which can provide stable electrical performance and reduce the resistance of the floating gate 110. In addition, in some embodiments, the floating gate 110 completely covers the tunneling dielectric layer 112, so that the current can be stably injected into or out of the floating gate 110 to provide stable electrical performance. Furthermore, in some embodiments, the floating gate 110 covers the sidewall of the tunneling dielectric layer 112, so that the current can be more stably injected into or out of the floating gate 110, thereby improving the quality of the floating gate 110. In some embodiments, since the width W3 of the bottom surface of the second protrusion 104*c* is smaller than the width W2 of the top surface of the base portion 104*a*, the bottom surface of the floating gate 110 partially covers the top surface of the base portion 104*a*, which can improve the performance of the floating gate 110. In some embodiments, the material of the floating gate 110 includes a semiconductor material, such as doped polysilicon, undoped polysilicon, or a combination thereof. In some embodiments, the thickness H3 of the floating gate 110 ranges from about 50 nm to 100 nm, and the width W5 of the top surface of the floating gate 110 ranges from about 40 nm to 70 nm, but the invention is not limited thereto. The floating gate 110 may be formed by a suitable deposition process, such as CVD.

The method of the present disclosure for forming the memory structure can form the floating gate with a small scale and high critical dimension consistency on the substrate with the isolation structure according to the design requirements of the floating gate. According to embodiments provided by the present disclosure, a method for forming a memory structure includes: (1) providing a substrate with isolation structures each having a first protrusion; (2) replacing the first protrusion with a second protrusion; and (3) forming floating gates between the second protrusions. By forming the floating gates after the second protrusions replace the first protrusions, the CDU of the floating gates can be increased, thereby improving the performance of the memory structure. In addition, by using two etching processes during the process of the second protrusion, damage to the substrate can be avoided, thereby increasing the reliability and manufacturing yield of the memory structure.

Additional processes can then be performed to complete the memory. For example, following FIG. 7, an inter-gate dielectric layer 114 may be formed over the floating gate 110, and a control gate 116 may be formed over the inter-gate dielectric layer 114, as shown in FIG. 8. In some embodiments, the inter-gate dielectric layer 114 is a composite layer structure composed of silicon oxide/silicon nitride/silicon oxide, but the present disclosure is not limited thereto. In some embodiments, the material of the control gate 116 includes doped polysilicon, undoped polysilicon, or a combination thereof. The memory structure 100 of FIG. 8 is an example and is not intended to limit the present disclosure beyond the scope expressly recited in the claims.

The present invention is suitable for making miniaturized memory devices, for example, NOR flash memories, so as to increase the total number of dies on a wafer. Therefore, the production cost and energy consumption of manufacturing a single IC are reduced, and the production energy consumption of subsequent packaging is also reduced, thereby reducing carbon emissions in the process of producing flash memory. Besides, since reliability and yield of the memory device of the present invention are improved, the present invention provides a sustainable memory device.

Although some embodiments of the present invention and their advantages have been described in detail, it should be understood that various changes, substitutions, and alterations can be made herein without departing from the spirit and scope of the invention as defined by the scope of the invention. For example, one of ordinary skill in the art to which this invention pertains will readily appreciate that many of the components, functions, processes, and materials described herein may be changed without departing from the scope of the invention.

What is claimed is:

1. A method of forming a memory structure, comprising:

providing a substrate with a plurality of isolation structures, wherein the plurality of isolation structures comprise a plurality of first protrusions protruding above the substrate;

replacing the plurality of first protrusions with a plurality of second protrusions to define a plurality of predetermined regions of floating gates between the plurality of second protrusions, comprising:

forming an insulation filling material between the plurality of first protrusions and on the substrate; and performing a patterning process on the insulation filling material and the plurality of first protrusions to form the plurality of second protrusions to define the plurality of predetermined regions of floating gates, wherein the patterning process comprises forming a patterned mask layer on the insulation filling material, and performing a first etching process on the insulation filling material and/or the plurality of first protrusions with the patterned mask layer; and forming a plurality of floating gates in the plurality of predetermined regions of floating gates.

2. The method of forming the memory structure of claim 1, wherein the plurality of isolation structures have an aspect ratio greater than 1.

3. The method of forming the memory structure of claim 2, wherein each of the plurality of isolation structures further comprises a base portion under each of the plurality of first protrusions and located in the substrate.

4. The method of forming the memory structure of claim 3, wherein a width of a bottom surface of each of the plurality of second protrusions is smaller than a width of a top surface of the base portion of each of the plurality of isolation structures.

5. The method of forming the memory structure of claim 3, wherein a width of a top surface of each of the second protrusions is smaller than a width of a top surface of the base portion of each of the plurality of isolation structures.

6. The method of forming the memory structure of claim 4, wherein a width of each pattern of the patterned mask layer is smaller than a width of a top surface of the first protrusion of the isolation structure.

7. The method of forming the memory structure of claim 1, wherein the insulation filling material comprises a same material as each of the plurality of first protrusions.

8. The method of forming the memory structure of claim 1, wherein each of the plurality of first protrusions include undoped silicon oxide.

9. The method of forming the memory structure of claim 1, further comprising:

performing a chemical mechanical polishing (CMP) process on the insulation filling material and/or each of the plurality of first protrusions before the patterning process.

10. The method of forming the memory structure of claim 1, wherein the location of each pattern of the patterned mask layer corresponds to a location of one of the plurality of isolation structures, and the insulation filling material remains covering a top surface of the substrate after the first etching process, and wherein the first etching process comprises a dry etching process, a wet etching process, or a combination thereof.

11. The method of forming the memory structure of claim 10, wherein the patterning process further comprises:

performing a second etching process on the insulation filling material and/or the first protrusions of the predetermined regions of floating gates to expose the top surface of the substrate to form the second protrusions.

12. The method of forming the memory structure of claim 11, wherein the first etching process is a dry etching process, and the second etching process is a wet etching process.

13. The method of forming the memory structure of claim 12, wherein the wet etching process uses hydrofluoric acid, hot phosphoric acid, or a combination thereof.

14. The method of forming the memory structure of claim 1, wherein the insulation filling material has a trapezoidal structure after the patterning process.

15. The method of forming the memory structure of claim 1, further comprising:

after the patterning process, forming a plurality of tunneling dielectric layers over a top surface of the substrate in the plurality of predetermined regions of floating gates.

16. The method of forming the memory structure of claim 15, wherein the plurality of floating gates completely cover the tunneling dielectric layers.

17. The method of forming the memory structure of claim 15, wherein steps of forming the floating gates comprise:

depositing a floating gate material over the plurality of tunneling dielectric layers in the plurality of predetermined regions of floating gates and over the second protrusions;

performing a planarization process on the floating gate material until top surfaces of the plurality of second protrusions are exposed, leaving remaining floating gate material between the second protrusions as the floating gates.

18. The method of forming the memory structure of claim 17, wherein the floating gate material comprises doped polysilicon, undoped polysilicon, or a combination thereof.

19. The method of forming the memory structure of claim 1, wherein the floating gates have an inverted trapezoidal shape.

20. The method of forming the memory structure of claim 1, wherein a bottom surface width of the plurality of floating gates is greater than a top surface width of the substrate between the plurality of isolation structures.

* * * * *